United States Patent [19]
Leehan

[11] 3,970,875
[45] July 20, 1976

[54] LSI CHIP COMPENSATOR FOR PROCESS PARAMETER VARIATIONS

[75] Inventor: Gerald William Leehan, Centreville, Va.

[73] Assignee: International Business Machines Corporation, Armonk, N.Y.

[22] Filed: Nov. 21, 1974

[21] Appl. No.: 526,020

[52] U.S. Cl. .............................. 307/304; 307/297; 307/303; 307/251
[51] Int. Cl.² ...................................... H03K 3/353
[58] Field of Search ........... 307/304, 297, 205, 204, 307/203, 251

[56] References Cited
UNITED STATES PATENTS

| | | | |
|---|---|---|---|
| 3,657,575 | 4/1972 | Taniguchi et al. | 307/304 |
| 3,703,650 | 11/1972 | Kendall | 307/304 |
| 3,806,742 | 4/1974 | Powell | 307/304 |
| 3,840,829 | 10/1974 | Fletcher et al. | 307/304 |

*Primary Examiner*—Saxfield Chatmon, Jr.
*Attorney, Agent, or Firm*—John E. Hoel

[57] ABSTRACT

An on chip field effect transistor circuit is disclosed for electrically compensating for variations in process parameters which have occurred during the course of fabrication of the integrated circuit chip as well as variations in environmental parameters such as supply voltages and temperature. The compensation is performed by utilizing three field effect transistor devices on the integrated semiconductor chip as a sensor to detect variations in the characteristics of the devices due to deviations in the process parameters during fabrication thereof. The sensing field effect transistors operate in a circuit to adjust the gate potential of FET load devices in those functional circuits on the integrated circuit chip whose sensitivity to the variations in the process parameters is critical to the operation of the circuit as a whole.

14 Claims, 5 Drawing Figures

COMPENSATOR WITH ON CHIP AMPLIFIER AND FUNCTIONAL CIRCUITRY

LSI CHIP COMPENSATOR FOR PROCESS PARAMETER VARIATIONS

FIELD OF THE INVENTION

The invention relates generally to control and stabilization techniques which utilize negative feedback to set the operating point of transistor devices. More specifically, it relates to the adjustment and stabilization of the performance of FET linear load circuitry by controlling the load gate potential for load devices in a plurality of FET circuits on the semiconductor chip.

BACKGROUND OF THE INVENTION

The design of static or dynamic, ratioed linear FET circuitry follows three conventional steps. First, the selection of a maximum allowable power distribution is made for the design, given the thermal limits of the technology and the application. Secondly, the nominal load device dimensions are selected such that the power defined in the first step will not be exceeded despite variations in process parameters such as threshold, transconductance, or topological variation. In addition, variations in environmental parameters such as power supply voltages or temperatures must be taken into consideration, with the wider variations in parameters requiring a smaller permissible nominal power in the load device and the consequent slower performance for the circuit. Thirdly, the minimum active device dimensions are selected such that the circuit exhibits acceptable voltage gain and noise immunity despite worst case parameter variations. Larger parameter variations lead to larger active devices which in turn present increased loading to the circuits that drive them, thereby slowing wave form propagation in the circuit. After these three steps in the design of ratioed linear load FED circuitry have been executed, all degrees of freedom have been specified. Although the circuit's nominal performance is completely determined, the circuit's worst case performance will be slower than that nominal performance by an amount that increases with the tolerance in the process and environmental parameters. Thus, the resulting circuit design may only be used in those applications that can tolerate this worst case performance.

Variations in process and environmental parameters degrade the design by increasing the maximum power dissipation of the circuit, by requiring an increased size in the devices to maintain the desired gain, and by increasing the ratio of worst case to nominal performance of a circuit designed to these power and gain constraints.

Attempts have been made in the prior art to compensate for variations in process parameters on a LSI chip, an example of which is the Pleshko, et al. U.S. Pat. No. 3,609,414 filed Aug. 20, 1968 and assigned to the instant assignee. Pleshko discloses an on-chip circuit for compensating for variations in the process parameters by compensating for the resulting threshold voltage variation in FET devices embodied in the chip by controlling the substrate voltage of the chip. Although the Pleshko, et al. invention works well for its particular application, it has the disadvantage of imposing the compensation on every circuit on the chip, thereby precluding the selective compensation of multiple threshold circuits such as enhance/deplete FET circuitry. An additional problem with the Pleshko, et al. compensation technique is that in an N-channel device compensated by substrate voltage control, high threshold voltages would be compensated by low substrate bias voltages. Low substrate bias voltages increase the junction capacitance which further degrades performance of the circuits. Also, low substrate bias voltages may increase the probability of parasitics formed by surface inversion at low substrate bias.

OBJECTS OF THE INVENTION

It is an object of the invention to compensate for the effects of variations in process parameters on the performance characteristics of a LSI chip, in an improved manner.

It is another object of the invention to compensate for variations in threshold voltages of FET devices on an LSI chip, in an improved manner.

It is still another object of the invention to compensate for variations in the transconductance of FET devices on an LSI chip, in an improved manner.

It is still a further object of the invention to compensate for variations in the gate width of FET devices on an LSI chip, in an improved manner.

It is a further object of the invention to compensate for variations in the active device length of FET devices on an LSI chip, in an improved manner.

It is still a further object of the invention to compensate for variations in the diffusion resistance of FET devices on an LSI chip, in an improved manner.

It is still another object of the invention to compensate for variations in the drain voltage supply to FET devices in an LSI chip, in an improved manner.

It is yet another object of the invention to compensate for variations in the load gate length in FET circuits on an LSI chip, in an improved manner.

SUMMARY OF THE INVENTION

An on-chip field effect transistor circuit is disclosed for electrically compensating for variations in process parameters which occurred during the course of the fabrication of the integrated circuit chip. The compensation is performed by utilizing three field effect transistor devices on the integrated circuit chip as a sensor to detect changes in the characteristics of the devices due to process parameter variations. The sensing field effect transistors operate in a circuit to adjust the gate potential of FET load devices in those functional circuits on the integrated circuit chip whose sensitivity to variations in the process parameters is critical to the operation of the circuit as a whole. The sensing circuit contained on the same LSI chip as the functional circuitry being regulated, is connected to an inverting amplifier which has a transfer characteristic relatively independant of variations in the process parameters that determine the performance of the functional circuitry being regulated. The compensation circuit has particular application to ratioed linear load FET circuitry of either the static or dynamic type.

DESCRIPTION OF THE DRAWINGS

The foregoing and other objects, features and advantages of the invention will be apparent from the following more particular description of the preferred embodiments of the invention, as illustrated in the accompanying drawings.

DISCUSSION OF THE PREFERRED EMBODIMENT

Figure 1:
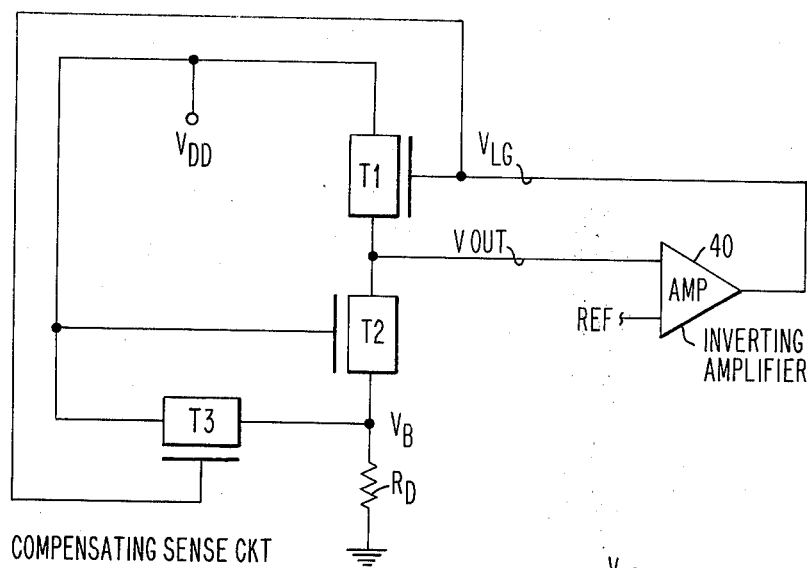
FIG. 1 is a schematic diagram of the compensating sense circuit.
Figure 2:
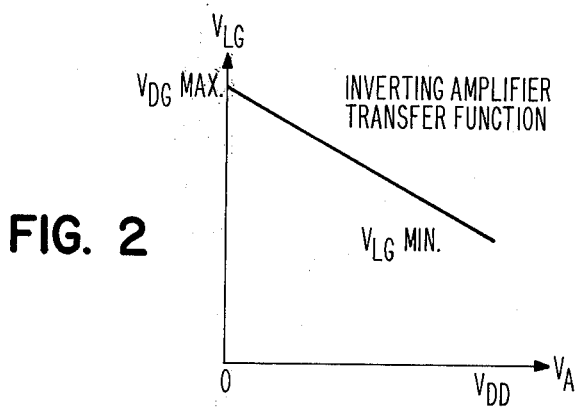
FIG. 2 is a graph of a load gate voltage vs. output voltage characteristic of the inverting amplifier.

The present compensating circuit invention seeks to compensate for parametric variations by means of regulating the load gate voltage of functional circuits on the LSI chip.

Theory

The primary effect of a load gate voltage ($V_{LG}$) increase is an increase in load device current. With this in mind, let us consider the $V_{LG}$ modification required to compensate for each of the following parametric variations.

Threshold Variations

If threshold voltages are low, circuit active devices will be more sensitive to high down levels on the circuit outputs driving them, also the down levels themselves will tend to be high because the low $V_T$'s cause increased current flow and hence voltage drops in drain diffusions. Consequently, it is desirable to decrease load device current by decreasing $V_{LG}$ when thresholds are low to preserve good DC noise immunity.

Since low $V_T$'s cause higher currents, it is desirable to compensate for low $V_T$'s with lower $V_{LG}$'s to maintain nearly constant currents and minimize power dissipation variation.

Since high $V_T$'s make less current available for changing capacitors, it is desirable to compensate high $V_T$'s with high $V_{LG}$ to minimize variation in capacitor charging current and therefore in delay.

High thresholds are sometimes indicative of high substrate doping and consequently high diffusion capacitance. Therefore, it is desirable to compensate for this higher capacitance with higher charging currents achievable with higher $V_{LG}$.

Transconductance Variation

An increase in transconductance causes increase current flow in a linear load circuit. This results in increased power dissipation and increased down levels (because of increased current flow in parasitic source resistances). The solution to both the dissipation and the DC design (level) problem is to compensate for increased transconductance with decreased load gate voltage.

A decrease in transconductance causes less current to be available to charge capacitors. This can be compensated by an increase in load gate voltage.

Gate Width Variation

Mask, exposure, and etch variations cause device width variations. These variations are far more important in load than active device gates because of the load's smaller nominal width dimension. Increased load gate widths cause increased power and higher down levels and so are compensated by lower load gate voltages. Small load gate widths decrease charging current and should be compensated by increased gate voltage to maintain constant performance.

Active Device Length Variation

Active or input devices are usually designed with minimum channel lengths and are thus more vulnerable to channel variation. A long channel device is less effective in sinking load device current, consequently it is desirable to compensate for them with reduced load gate current (by decreasing $V_{LG}$) to preserve low down levels (DC design) and fast turn on times. Since power dissipation is primarily determined by load device parameters and since load devices are designed with longer than minimum channels, power dissipation is insensitive to channel length variation.

Short channels are indicative of oversized diffusions. Large diffusions in turn imply excessive capacitance from diffusion to substrate. In addition, large diffusions imply that a larger portion of each gate is over diffusion rather than channel such that more thin oxide capacitance is likely to be enhanced by the Miller effect. In summary, short channels imply increased capacitive net loading and are properly compensated by increased charging current obtained by increasing load gate voltage.

Diffusion Resistance Variation

Increased parasitic diffusion in the sources and drains of active devices causes down levels to rise unless it is properly compensated by decreasing DC current flow in the circuit (reducing $V_{LG}$).

Reduced resistances are sometimes indicative of oversized diffusions and increased capacitance as discussed in conjunction with active device length variations above. Consequently reduced resistance is properly compensated with increased $V_{LG}$.

Drain Voltage Supply Variation

In a linear load design, drain voltage variations have little influence on DC levels or AC performance. Power dissipation, however is directly proportional to drain voltage. Therefore, it is desirable to compensate for increasing drain voltage by decreasing load gate voltage (and consequently load device current and circuit power).

Load Gate Length, Active Device Width

Figure 3:
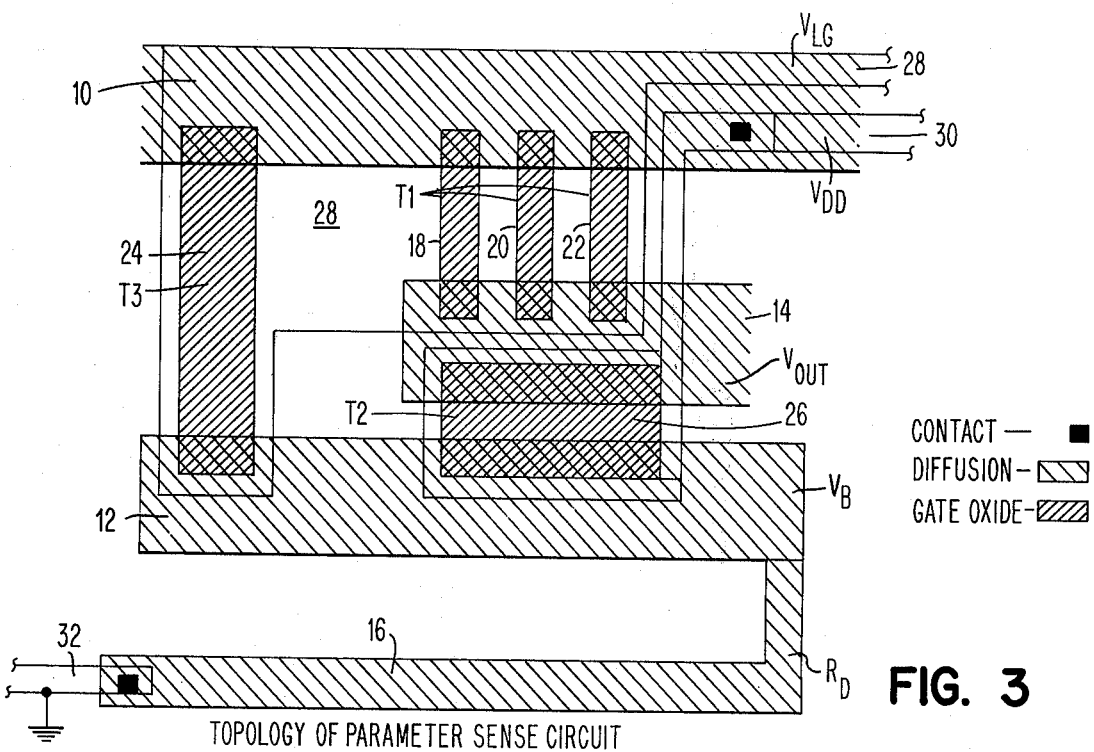
FIG. 3 illustrates a typical topology of the layout of the parameter sensing circuit.

Since the nominal values of these dimensions are typically much larger than their associated variations, it is not necessary to compensate for such variations. Designs wherein nominal values of these parameters are not magnitudes larger than their variations can be converted into designs having this typical property by replacing each short load devices with a long load device having two or more minimum width channels in parallel to achieve the same composite devices effective width to length ratio. Similarly, narrow active devices can be converted into series strings of minimum length, non minimum width devices. The sense circuit topology shown in FIG. 3 illustrates the use of this technique to create a load device that is maximally sensitive to gate width variations and minimally sensitive to channel length variations.

Compensation Circuit Invention

The regulator is shown in circuit schematic form in FIG. 1. A typical layout is shown in FIG. 3. The regulator comprises three transistors and a resistor contained on the same chip as the functional circuitry being compensated and an inverting amplifier which may or may not be on the same chip and which has transfer characteristics which are relatively independent of the parameters that determine the performance of the functional circuitry.

Transistor T-1 is a minimum width, non-minimum length MOS device having its drain connected to the drain potential ($V_D$) utilized by the functional circuitry, its source connected to the drain of T-2 and to the input of an inverting amplifier, and its gate connected to the same source of load gate potential utilized by the functional circuitry. For proper operation T-1's conductance must be sensitive to variations in channel widths. This can be accomplished even though large effective width to length ratios are required for other design considerations by connecting several minimum width, non-minimum length gates in parallel such that the ratio of the sum of the widths to the length is equal to the desired effective ratio. FIG. 3 shows a three gate layout of this type. (Note that similar techniques could be used to construct devices maximally sensitive to channel length).

Transistor T-2 is a minimum length device having its drain connected to the source of T-1, its gate connected to $V_D$, and its source connected to the source of T-3 and through a minimum width diffused resistor ($R_D$) to ground.

Transistor T-3 is a larger than minimum width, larger than minimum length device having its source connected to $R_D$ and the source of T-2, its gate connected to $V_{LG}$, and its drain connected to $V_D$.

Figure 4:
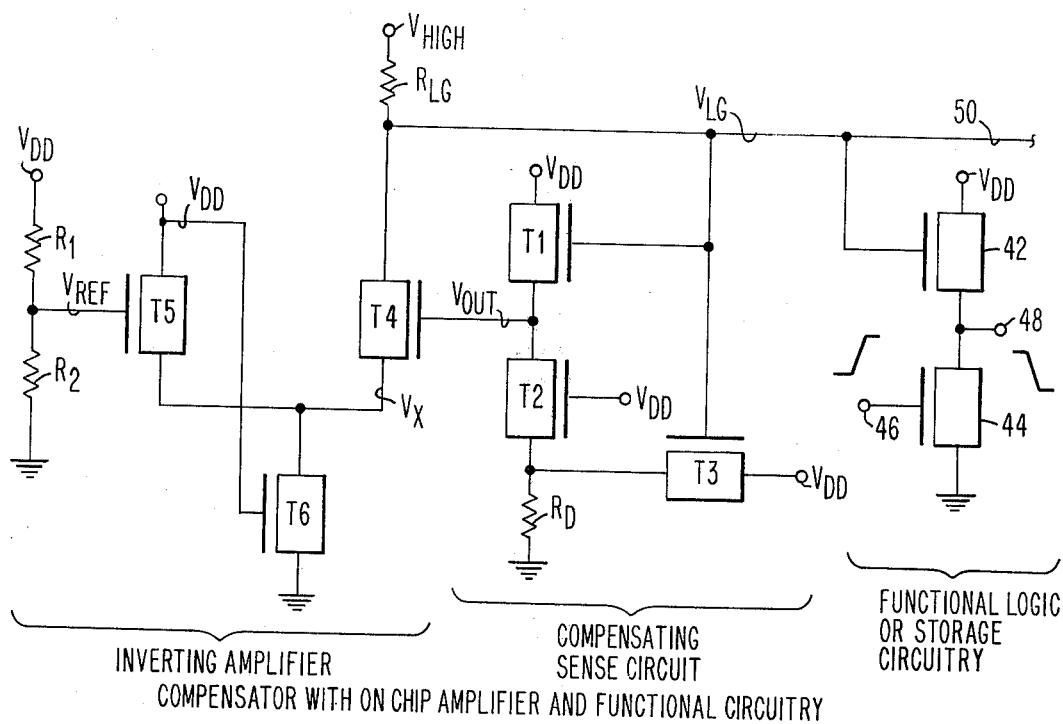
FIG. 4 is a circuit diagram illustrating the interconnection of the compensator with the on chip inverting amplifier and the functional circuitry being regulated.

The compensating sense circuit is shown with an on-chip version of the inverting sense amplifier comprised of transistors T4, T5 and T6, and a typical linear load functional circuit comprised, for example, of transistors 42 and 44 in FIG. 4. The output $V_{OUT}$ of the compensating circuit is inverted by the inverting sense amplifier, and the resulting voltage $V_{LG}$ is the compensating, load gate voltage supplied to the functional circuits.

The width to length ratios of T-1, T-2, and T-3, as well as the length of $R_D$ are chosen to optimize the sensitivity of $V_{LG}$ to parameter variation and to minimize power dissipation in the compensator.

The simple sense amplifier shown in conjunction with the compensator in FIG. 4 consists of a voltage divider reference generator (R1, R2, $V_{DD}$, Ground) and a differential amplifier. T-4 and T-5 are high gain (large w/l) FET's T-6 is an FET current source, and $R_{LG}$ is an off chip resistor.

Operation

The function of the sense circuit in FIG. 1 is to produce output voltage variations which are opposite in sign to the $V_{LG}$ correction required to compensate, as shown in Table 1 and described above for the parametric aberation. It does so in the following manner:

Threshold variation: Large thresholds cause less current to flow in all transistors and consequently in $R_D$. Therefore $V_B$ decreases, T-2 is further forward biased, and $V_{OUT}$ falls. The output of the inverting sense amplifier, $V_{LG}$, rises, thereby turning load transistor 42 on harder, compensating for the threshold voltage change.

Transconductance variation: High transconductance causes more current to flow in all transistors, and thus thru $R_D$, causing $V_B$ to rise, partially cutting off T-2. As T-2 cuts off, $V_{OUT}$ rises, and $V_{LG}$ falls, reducing the load gate voltage on load device 42, compensating for the variation in transconductance.

Load gate width: Increased load gate width increases the conductance of T1 relative to the other transistors T2 and T3. Thereby increasing $V_{OUT}$. The output $V_{LG}$ of the inverting sense amplifier falls, thereby reducing the gate voltage on load device 42, compensating for the change in load gate width.

Active length: A longer channel length in T-2 causes it to be less conductive without appreciably altering the current flow thru T3. Consequently, $V_{OUT}$ rises and the load gate voltage $V_{LG}$ falls, thereby compensating for the change in active gate length.

Drain Voltage: Increased drain voltage ($V_{DD}$) increases the current flowing in T3 and in T-1. These increased currents increase $V_B$ which tends to cut off T-2. Since T-2 must now conduct more current with higher source bias its source to drain voltage will increase, increasing $V_{OUT}$. (Note thart the presence of $V_{DD}$ on the gate of T-2 will tend to make T-2 more conductive, thereby moderating this effect.) Consequently, $V_{LG}$ decreases, compensating for the change in drain voltage.

Diffusion Resistance $R_D$ — As $R_D$ increases, $V_B$ increases, tending to cut off T-2, causing $V_{OUT}$ to rise. Consequently, $V_{LG}$ falls, thereby compensating for the change in diffusion resistance.

Inverting Amplifier: The function of the inverting amplifier shown in FIG. 4, is to establish a load gate voltage ($V_{LG}$) which will sustain the compensating sense circuit output at a value approximately equal to the reference potential (shown here as being derived from a resistor divider).

T-6 acts as a current source if $V_{OUT}$ rises substantially above $V_{REF}$ T-4 will conduct raising Vx and cutting off T-5. The increased current flow in $R_{LG}$ will cause $V_{LG}$ to fall. If T-4 has sufficient gain and if $R_{LG}$ is sufficiently large compared to the resistance of T-6, it will not be possible for $V_{OUT}$ to rise far above $V_{REF}$ without causing $V_{LG}$ to fall and reduce the conductance of T-1 and consequently reduce $V_{OUT}$. If $V_{OUT}$ falls below $V_{REF}$, T-4 will tend to cut off and $V_{LG}$ will rise toward $V_{HIGH}$. However the increase $V_{LG}$ applied to the compensator will increase $V_{OUT}$ until equilibrium is again established.

TABLE 1

| Parameter | To Optimize DC Design Ratio | To Minimize Delay Variation | To Minimize Power Dissipation Variation | Generated $V_{LG}$ |
|---|---|---|---|---|
| Threshold Vt | + | + | + | + |
| Transconductance | − | − | − | − |
| Load Device Width Wl | − | − | − | − |
| Active Device Length La | − | − | Insensitive | − |
| Diffusion Resistance Rd | − | Insensitive | Insensitive | − |
| Drain Voltage Vd | Slightly + | Insensitive | − | − |
| Load Length Ll | Insensitive | Insensitive | Insensitive | Insensitive |

TABLE 1-continued

| Parameter | To Optimize DC Design Ratio | To Minimize Delay Variation | To Minimize Power Dissipation Variation | Generated $V_{LG}$ |
|---|---|---|---|---|
| Active Device Width Wa | Insensitive | Insensitive | Insensitive | Insensitive |

Depletion Load Embodiment

Figure 5:
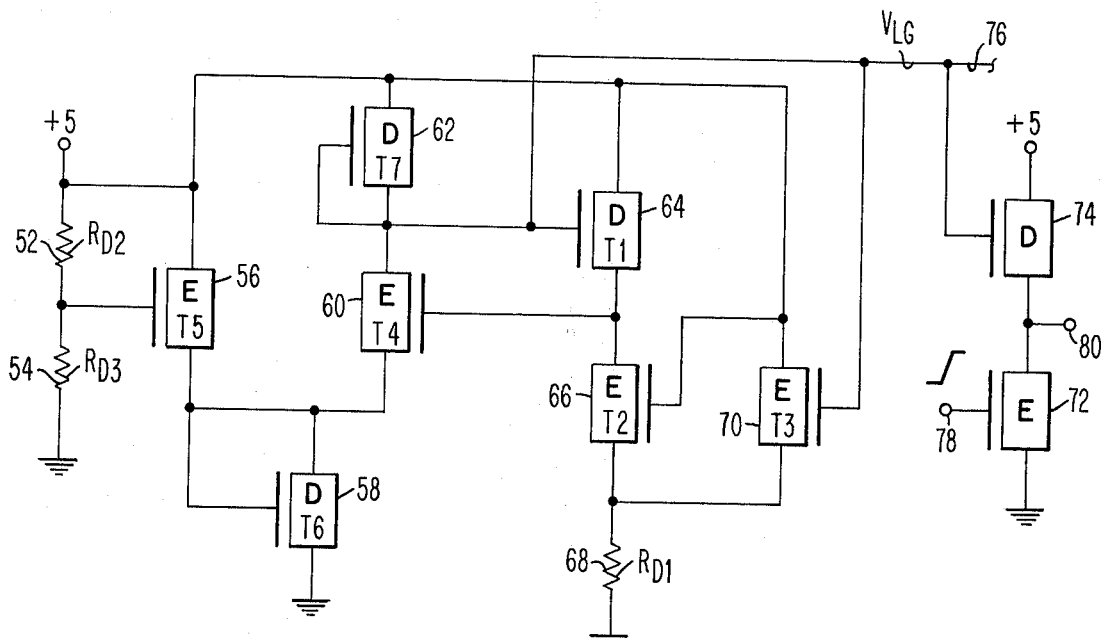
FIG. 5 is a load gate compensation circuit for regulating enhancement/depletion type FET circuits.

It is well known that depletion mode load devices can be used to improve the power-performance characteristics of the uncompensated logic circuits. This approach has the additional benefit of eliminating the customary linear load requirement of a separate higher voltage power supply for the load gate. FIG. 5 illustrates an adaption of the load gate compensator to a single supply depletion mode load technology. Such a configuration has superior power-performance-density characteristics to the uncompensated depletion mode technology. Although, it requires the routing of a voltage bus to all load gates this is a small penalty. This compensation technique is probably inferior in power-performance and density to the sample linear load compensation scheme described above because of the additional uncertainty introduced in the threshold of the load device and because of the reduced dynamic range of the compensated load gate potential. However, this scheme eliminates the need for a positive (+12) supply other than $V_{DO}$, an off chip resistor, and a load gate pad connection on the chip.

Multiple Compensators

It is obvious that different circuit designs will have different sensitivities (correlation coefficients) to each specific type of parameter variation. For example, circuits using ion implanted depletion mode load devices are sensitive to the characteristics of the implant, but they may be less sensitive to load gate width variation than enhancement load circuits. Consequently, two compensation networks could be constructed to support both enhancement and depletion load circuits on the same chip. This is an advantage over the prior art compensators which utilized substrate potential as a control parameter and were therefore limited to one compensation circuit per substrate (chip).

To summarize, the compensation circuit invention disclosed herein compensates for most of the troublesome parametric variations incurred during the course of the fabrication of an LSI chip. Use of this compensation circuit permits the design of large scale integrated circuit FET devices having a nominal circuit power closer to worst cast allowable, employing smaller active devices, and having signal propagation delays closer to the intended nominal value. The compensation circuit invention is DC stable and requires no chip connections other than the customary load, drain, and ground supply leads in its enhancement load embodiment. It requires one external resistor. It does not cause substrate voltage variation as many $V_{SX}$ compensators known in the prior art and therefore if does not lead to problems of unwanted inversion, leakage, or diffusion capacitance variation.

While the invention has been particularly shown and described with reference to the preferred embodiments thereof, it will be understood by those skilled in the art that the foregoing and other changes in form and the details to be made therein without departing from the spirit in the scope of the invention.

I claim:
1. Stabilization and control apparatus comprising:
 a semiconductor substrate containing a plurality of functional field effect transistor circuits in the linear load configuration with an FET active device and an FET load device;
 a compensating sense circuit integral with said substrate and comprising FET means, for detecting variations in the performance of said FET means resulting from variations in process parameters, and outputting a voltage with magnitude which varies in accordance with said variation in said process parameters;
 said FET means including a first FET means having a drain-to-source current whose response to said variations in process parameters is proportional to the response of the drain-to-source current in said FET load device in said functional circuit, to said variations in process parameters;
 said FET means further including a second FET means having a drain-to-source current whose response to said variations in process parameters is proportional to the response of the drain-to-source current in said FET active device in said functional circuit, to said variations in process parameters;
 an amplifier integral with said substrate and connected to a reference potential, having an input connected to said output voltage from said compensating circuit, for outputting a load gate correction voltage to the gate of the load device in each of said functional FET circuits to be regulated;
 whereby the load gate voltage for functional FET circuits is regulated so as to compensate for variations in the process parameters which obtain during the fabrication of the LSI chip.
2. Stabilization and control apparatus comprising:
 a semiconductor substrate containing a plurality of functional field effect transistor circuits in the linear load configuration;
 a compensating sense circuit integral with said substrate and comprising FET devices, for detecting variations in the performance of said devices resulting from variations in process parameters, and outputting a voltage with magnitude which varies in accordance with said variation in said process parameters;
 an amplifier integral with said substrate and connected to a reference potential, having an input connected to said output voltage from said compensating circuit, for outputting a load gate voltage to the gate of the load device in each of said functional FET circuits to be regulated;
 said compensating sense circuit further comprising:
 the first FET transistor having a minimum width, non-minimum length gate, with its drain connected to the drain potential, its source connected to the input of said amplifier and its gate connected to the load gate potential of the functional FET circuitries;
a second FET transistor having a minimum length gate, with its drain connected to the source of said first transistor, its gate connected to said drain potential and its source connected through a diffused resistor, to ground potential;
a third FET transistor having a larger than minimum width, larger than minimum length gate, with its source connected to the source of said second transistor, its gate connected to said load gate voltage and its drain connected to said drain potential;
whereby a voltage signal is output on said output node which is the load gate voltage correction required to compensate for parametric variations detected.

3. The stabilization and control apparatus of claim 2, wherein said first, second, and third FET devices are of the enhancement mode type.

4. The stabilization and control circuit of claim 3, wherein said load device in said functional FET circuit is an FET of the enhancement type.

5. The stabilization and control apparatus of claim 2, wherein said first FET device is a depletion mode type, said second FET device is an enhancement mode type and said third FET device is an enhancement mode type.

6. The stabilization and control apparatus of claim 5, wherein said load device in said functional FET circuit is an FET device of the depletion type.

7. The stabilization and control apparatus of claim 2, wherein said amplifier further comprises:
a differential amplifier having a fourth FET transistor with a gate connected to said output node of said compensating sense circuit and the source connected to the source of a fifth FET transistor having its gate connected to a reference potential;
said fourth transistor having a drain connected through a resistor to a high potential source and forming a node at which said load gate voltage is produced.

8. A stabilization and control apparatus comprising:
a semiconductor substrate containing a plurality of functional field effect transistor circuits in the linear load configuration with an FET active device and an FET load device;
a compensating sense circuit integral with said substrate and comprising FET means, for detecting variations in the performance of said FET means resulting from variations in process parameters, and outputting a voltage with magnitude which varies in accordance with said variation in said process parameters;
said FET means including a first FET means having a drain-to-source current whose response to said variations in process parameters is proportional to the response of the drain-to-source current in said FET load device in said functional circuit to said variations in process parameters;
said FET means further including a second FET means having a drain-to-source current whose response to said variations in process parameters is proportional to the response of the drain-to-source current in said FET active device in said functional circuit to said variations in process parameters;

an amplifier connected to a reference potential, having an input connected to said output voltage from said compensating circuit, for outputting a load gate correction voltage to the gate of the load device in each of said functional FET circuits to be regulated;
whereby the load gate voltage for functional FET circuits is regulated so as to compensate for variations in the process parameters which obtained during the fabrication of the LSI chip.

9. A stabilization and control apparatus comprising:
a semiconductor substrate containing a plurality of functional field effect transistor circuits in the linear load configuration;
a compensating sense circuit integral with said substrate and comprising FET devices, for detecting variations in the performance of said devices resulting from variations in process parameters, and outputting a voltage with magnitude which varies in accordance with said variation in said process parameters;
an amplifier connected to a reference potential, having an input connected to said output voltage from said compensating circuit, for outputting a load gate voltage to the gate of the load device in each of said functional FET circuits to be regulated;
said compensating sense circuit further comprising:
the first FET transistor having a minimum width; non-minimum length gate, with its drain connected to the drain potential, its source connected to the input of said amplifier and its gate connected to the load gate potential of the functional FET circuitries;
a second FET transistor having a minimum length gate, with its drain connected to the source of said first transistor, its gate connected to said drain potential and its source connected through a diffusion resistor, to ground potential;
a third FET transistor having a larger than minimum width, larger than minimum length gate, with its source connected to the source of said second transistor, its gate connected to said load gate voltage and its drain connected to said drain potential;
whereby a voltage signal is output on said output node which is the load gate voltage correction required to compensate for parametric variations detected.

10. The stabilization and control apparatus of claim 9, wherein said first, second, and third FET devices are of the enhancement mode type.

11. The stabilization and control apparatus of claim 10, wherein said load device in said functional FET circuit is an FET of the enhancement type.

12. The stabilization and control apparatus of claim 9, wherein said first FET device is a depletion mode type, said second FET device is an enhancement mode type and said third FET device is an enhancement mode type.

13. The stabilization and control apparatus of claim 12, wherein said load device in said functional FET circuit is an FET device of the depletion type.

14. The stabilization and control apparatus of claim 9, wherein said amplifier constitutes circuit structure separate from said semiconductor substrate.

* * * * *